United States Patent
Takafuji et al.

(10) Patent No.: US 6,909,304 B2
(45) Date of Patent: Jun. 21, 2005

(54) DISPLAY DEVICE AND SCANNING CIRCUIT TESTING METHOD

(75) Inventors: Yutaka Takafuji, Nara (JP); Katsunori Shirai, Nara (JP); Akira Shibazaki, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 10/378,342

(22) Filed: Mar. 3, 2003

(65) Prior Publication Data

US 2003/0173991 A1 Sep. 18, 2003

(30) Foreign Application Priority Data

Mar. 18, 2002 (JP) .......................... 2002-075055

(51) Int. Cl.[7] .................. G01R 31/00; G09G 3/36
(52) U.S. Cl. .............. 324/770; 324/763; 345/100
(58) Field of Search ................ 324/770, 765, 324/763, 73.1, 158.1; 345/100

(56) References Cited

U.S. PATENT DOCUMENTS

| | | | | |
|---|---|---|---|---|
| 4,942,577 A | * | 7/1990 | Ozaki | .......................... 714/731 |
| 5,173,864 A | * | 12/1992 | Watanabe et al. | ............... 716/6 |
| 5,453,991 A | * | 9/1995 | Suzuki et al. | ................ 714/724 |
| 6,191,770 B1 | * | 2/2001 | Kim | ........................... 345/100 |
| 6,697,041 B1 | * | 2/2004 | Tamai et al. | ................ 345/100 |
| 6,703,856 B2 | * | 3/2004 | Fujita | ......................... 324/770 |

FOREIGN PATENT DOCUMENTS

JP        06-194421        7/1994

* cited by examiner

*Primary Examiner*—Paresh Patel
(74) *Attorney, Agent, or Firm*—David G. Conlin; William J. Daley, Jr.; Edwards & Angell, LLP

(57) ABSTRACT

Each of a gate driver and a source driver periodically receives a clock signal and a start pulse, where the start pulse has a certain width and is shifted as shift data in the gate driver or source driver in synchronism with the clock signal. A logic circuit composed of an NAND gate and an inverter receives the start pulse and the shift data, the shift data being the output that is supplied after a predetermined delay from the last stage with respect to the shift direction. The output of the inverter is used to test scanning circuits. This provides a display device and a scanning circuit testing method, which enable the scanning circuits to be judged both surely and quickly, without increasing the area or complexity of the circuit.

25 Claims, 11 Drawing Sheets

DISPLAY DEVICE AND SCANNING CIRCUIT TESTING METHOD

FIELD OF THE INVENTION

The present invention relates to a display device that is capable of judging an operating state of a scanning circuit. The invention also relates to a scanning circuit testing method for such a display device.

BACKGROUND OF THE INVENTION

Conventionally, liquid crystal display devices of a monolithic type, used as a display device, are generally adapted to sample video data via analog switches that are controlled by shift registers.

For example, as shown in FIG. 11(a), the liquid crystal display device includes a pixel capacitor $C_{LC}$ and an auxiliary capacitor $C_s$ that are connected to each pixel in a pixel section, and TFTs (Thin Film Transistors) are provided at the intersections of a plurality of gate lines in the row direction and a plurality of data lines in the column direction. The gate lines are connected to a gate driver and the data lines are connected to a source driver.

Further, counter electrodes are provided opposite the TFTs and a liquid crystal layer. The counter electrodes receive a counter voltage $V_{COM}$ to drive the liquid crystal.

The gate driver successively outputs gate pulses to sequentially scan the gate lines and select pixels of a row per horizontal period.

The source driver, using the shift registers, sequentially scans the data lines per horizontal period, so as to point-sequentially write video data to the pixels of a sampled and selected row. This enables image display.

The source driver includes shift registers and analog switches, as shown in FIG. 11(b).

As in normal display as above, in testing the driver for malfunction, the analog switches that are controlled by the shift registers are also used to sample video data Vvideo 1 and Vvideo 2, which are supplied to the source driver.

Namely, testing of the driver is carried out in the same manner as in normal display in that the driver is first operated to write data into the pixels and operated again to read out the charge held in each pixel, using the analog switches. The operating state of the driver is tested or judged by this operation, by way of finding defect pixels.

However, such a testing method is bound to a problem in that the S/N ratio and the accuracy of testing suffer as the pixel capacitance becomes smaller and the amount of charge read out is reduced, as in a small and fine resolution display device for projection use. The S/N ratio could be improved by increasing the number of measurements. In this case, however, testing needs to be carried out for extended periods of time.

Further, the foregoing method judges malfunction of the driver according to characteristics of defect pixels. Accordingly, data processing takes time, which lowers testing efficiency.

As a countermeasure, there has been proposed a display device of a structure in which pads are used to test the driver circuits (scanning circuits), for example as shown in FIG. 10.

In this example, two driver circuits are provided to render the display device redundancy. For example, even when one of the driver circuits fails, the operations of the display device as a whole are ensured with the normal driver circuit.

In another type of display device, as shown in FIG. 12, pads 103 are provided within or on the periphery of a gate driver 101 and a source driver 102. The pads 103 are fed with the output from the last stage of the scanning circuit of the driver and a testing probe is brought into contact with the pad 103 to detect a signal. Testing accuracy and testing efficiency are improved this way.

Further, Japanese Publication for Unexamined Patent Application No. 194421/1994 (Tokukaihei 6-194421; published on Jul. 15, 1994) proposes a semiconductor device in which a number of testing circuitry that is required for function tests is installed in a plurality of target circuits. The testing circuitry includes means for storing information for the function test, and means for transmitting structural information of the target circuit to the testing circuitry. In this way, the structure of the testing circuitry can be simplified and the testing means can be provided more conveniently, thereby carrying out BIST (Built-In Self Test) more efficiently.

However, the structure shown in FIG. 12 requires a plurality of pads 103, which are specifically designated for testing. Further, the provision of the two gate driver circuits increases the number of testing pads required, as shown in FIG. 10.

This inevitably increases the pad area under severe constraints on driver area particularly in small and fine resolution panels, mobile devices, and small and fine resolution display devices for projection use. Further, in view of space restriction on wiring and protection against ESD (Electrostatic Discharge), the stylus of the probe card must accommodate to the array of pads that greatly differs from that of input terminal pads for receiving external input signals.

Further, because the large area pads are directly connected to the logic circuits, the pads 103 function as an antenna to cause damage by ESD.

Further, the structure of the foregoing publication requires complex testing circuitry for the function tests. Installing such testing circuitry in a liquid crystal display device of a driver monolithic type is not practical when considering required processing accuracy that is determined based on the required level of micro-fabrication of the display section and the area of the display section, and when considering the circuit structure of the driver. Accordingly, there is a need for a more efficient testing method.

SUMMARY OF THE INVENTION

A main object of the present invention is to provide a display device and a scanning circuit testing method therefor, which enable scanning circuits to be tested both surely and quickly, without increasing the area or complexity of the circuit.

In order to achieve the foregoing object, a display device of the present invention includes: a gate driver for line-sequentially selecting pixels that are disposed in a matrix, so as to scan the pixels; a source driver for supplying a data signal to the pixels of a selected line; and a substrate, at least one of the gate driver and the source driver being monolithically formed on the substrate, wherein: the gate driver and the source driver each comprises a scanning circuit, and the scanning circuit of at least one of the gate driver and the source driver monolithically formed on the substrate periodically receives a clock signal and a start pulse, the start pulse having a certain width and being shifted as shift data in the scanning circuit in synchronism with the clock signal, and the start pulse is supplied to a first logic circuit with an output that is supplied after a predetermined delay from a last stage of the scanning circuit with respect to a shift direction of the shift data corresponding to the start pulse, so as to test the scanning circuit using a first output from the first logic circuit.

According to this arrangement, the start pulse and the shift data are used to test the scanning circuit, where the shift data is the output that is supplied after a predetermined delay from the last stage of the scanning circuit with respect to the shift direction.

In this way, because the pulse with a certain width is used as a test signal for logical operations, other pulses are prevented from being recognized as the test signal.

This ensures that the scanning circuit is judged properly. Namely, it is possible to judge whether the scanning circuit is operating properly.

Further, by monolithically forming the driver on the substrate, the scanning circuit of the driver (driving circuit) can be formed in the same process of forming the switching elements. This eliminates the need to additionally forming the driver LSI, for example, and thereby reduces manufacture cost and the number of installation steps.

Another display device of the present invention includes: a gate driver for line-sequentially selecting pixels that are disposed in a matrix, so as to scan the pixels; a source driver for supplying a data signal to the pixels of a selected line, and a substrate, the gate driver and the source driver being monolithically formed on the substrate, wherein: the gate driver and the source driver each comprises a scanning circuit that has switching means for switching shift directions, the scanning circuit periodically receiving a clock signal and a start pulse, the start pulse having a certain width and being shifted as shift data in the scanning circuit in synchronism with the clock signal, and the start pulse supplied to the scanning circuit of the gate driver in each shift direction is supplied to a first logic circuit with an output that is outputted after a predetermined delay from a last stage of the scanning circuit of the gate driver with respect to the shift direction of the shift data corresponding to the start pulse, the first logic circuit supplying a first output to a second logic circuit with respect to each shift direction, and wherein: the start pulse supplied to the scanning circuit of the source driver in each shift direction is supplied to a third logic circuit with an output that is supplied after a predetermined delay from a last stage of the scanning circuit of the source driver with respect to the shift direction of the shift data corresponding to the start pulse, the third logic circuit supplying a third output to a fourth logic circuit with respect to each shift direction, and the second logic circuit and the fourth logic circuit respectively supply a second output and a fourth output to a fifth logic circuit, and the fifth logic circuit supplies a fifth output that is used to test the scanning circuits of the gate driver and the source driver.

According to this arrangement, because the pulse with a certain width is used as a test signal for logical operations, other pulses are prevented from being recognized as the test signal.

This ensures that the scanning circuit is judged properly. Namely, it is possible to judge whether the scanning circuit is operating properly.

In addition, the scanning circuit can be judged properly, for example, even in devices such as small and fine resolution panels, mobile devices, and small and high resolution display devices for projection use, without increasing the area or complexity of the circuit.

Yet another display device of the present invention includes: a gate driver for line-sequentially selecting pixels that are disposed in a matrix, so as to scan the pixels; a source driver for supplying a data signal to the pixels of a selected line, and a substrate, the gate driver and the source driver being monolithically formed on the substrate, wherein: at least one of the gate driver and the source driver comprises: switching means for switching shift directions; and an analog switch for selecting a start pulse or an output from a last stage of either shift direction, the gate driver and the source driver each having a scanning circuit that periodically receives a clock signal and the start pulse in each shift direction, the start pulse having a certain width and being shifted as shift data in the scanning circuit in synchronism with the clock signal, and the output from the last stage of the scanning circuit is supplied to a logic circuit, and the logic circuit outputs a signal that is used to test the scanning circuits.

According to this arrangement, because the pulse with a certain width is used as a test signal for logical operations, other pulses are prevented from being recognized as the test signal.

This ensures that the scanning circuit is judged properly with a simple structure in either shift direction. Namely, it is possible to judge, both quickly and accurately, whether the scanning circuit is operating properly.

Still another display device of the present invention includes: a gate driver for line-sequentially selecting pixels that are disposed in a matrix, so as to scan the pixels; a source driver for supplying a data signal to the pixels of a selected line, and a substrate, at least one of the gate driver and the source driver being monolithically formed on the substrate, wherein: at least one of the gate driver and the source driver monolithically formed on the substrate comprises switching means for switching shift directions, at least one of the gate driver and the source driver monolithically formed on the substrate each having a scanning circuit that periodically receives a clock signal and the start pulse in each shift direction, the start pulse having a certain width and being shifted as shift data in the scanning circuit in synchronism with the clock signal, the switching means switching the shift directions from a first direction to a second direction after the start pulse has been shifted in the first direction and transferred to a last stage of the first direction, the shift data transferred to the last stage of the first direction being shifted in the second direction in synchronism with the clock signal, by being temporarily held in a latch circuit or by being directly supplied to the scanning circuit as data to be shifted in the second direction, the shift data transferred to a last stage of the second direction (i.e., input stage of the first direction) being used to test the scanning circuit.

According to this arrangement, the signal that is used to judge the scanning circuit is spatially returned to the input side of the shift register. This makes it possible to judge the scanning circuit. Namely, the scanning circuit can be judged whether it is operating properly in either direction. Further, unnecessary terminals or long signal wiring that are otherwise required can be eliminated to avoid complex wiring.

A scanning circuit testing method of the present invention includes the steps of: periodically supplying a clock signal and a start pulse to each of two scanning circuits of respective drivers, the start pulse having a certain width and being shifted in synchronism with the clock signal; and carrying out a logical operation using the start pulse and shift data, the shift data corresponding to the start pulse and being outputted from a last stage of the scanning circuit in a shift direction, so as to judge an operating state of each scanning circuit based on a result of the logical operation.

According to this method, the start pulse and the shift data are used to test the scanning circuits, where the shift data is the output that is supplied after a predetermined delay from the last stage of the scanning circuit in the shift direction.

Because the pulse with a certain width is used as a test signal for logical operations, other pulses are prevented from being recognized as the test signal.

This ensures that the scanning circuits are judged properly. Namely, it is possible to judge whether the scanning circuit is operating properly.

Another scanning circuit testing method comprising the steps of: periodically supplying a clock signal and a start pulse to a scanning circuit of a driver, the start pulse having a certain width and being shifted as shift data in synchronism with the clock signal; shifting the shift data in a first direction to a last stage of the first direction and temporarily holding the shift data in a latch circuit; switching the shift direction from the first direction to the second direction and shifting the shift data that was transferred to the last stage of the first direction further in the second direction, an output of a last stage of the second direction being used with a next start pulse to judge an operating state of the scanning circuit.

According to this method, it is ensured that the scanning circuits are judged in either direction.

For a fuller understanding of the nature and advantages of the invention, reference should be made to the ensuing detailed description taken in conjunction with the accompanying drawings.

DESCRIPTION OF THE EMBODIMENTS

[First Embodiment]

One embodiment of a display device according to the present invention is described below with reference to FIG. 1 through FIG. 6, and FIG. 9.

A liquid crystal display device (display device) of the present embodiment includes an active-matrix substrate and a counter substrate, which are disposed face to face via a liquid crystal layer. The liquid crystal display device also includes pixels that are provided in a matrix to make up a pixel array section.

Figure 9:
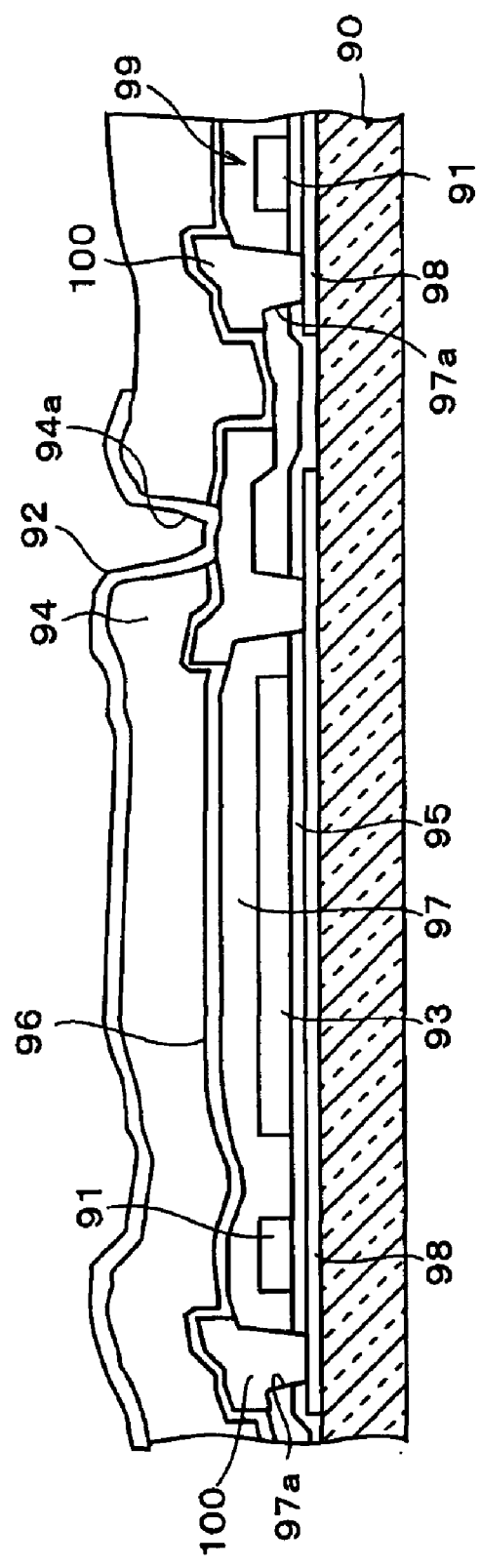
FIG. 9 is a cross sectional view schematically showing a structure of the liquid crystal display device.
Figure 10:
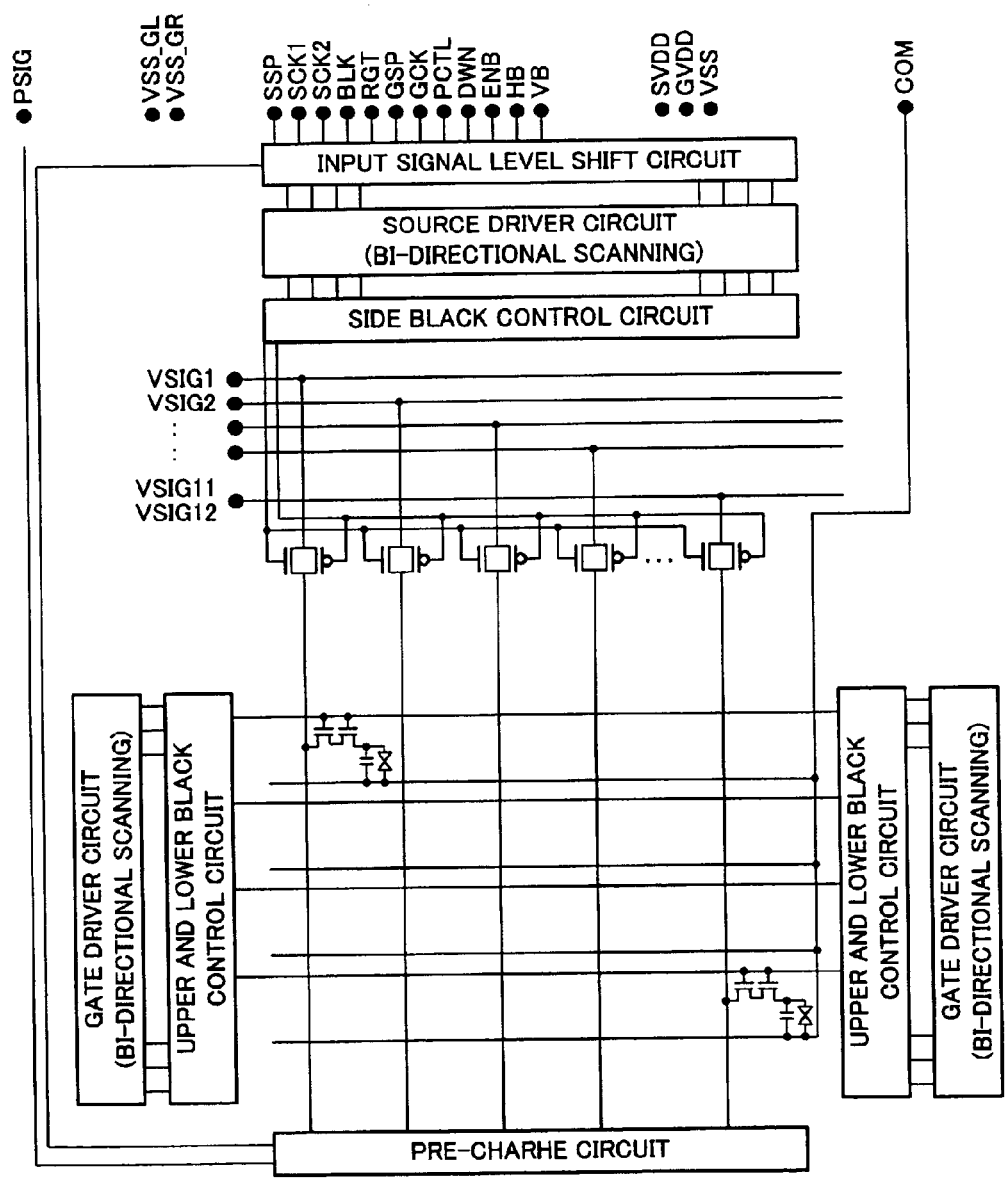
FIG. 10 is a circuit diagram schematically showing a conventional liquid crystal display device.
Figure 11A:
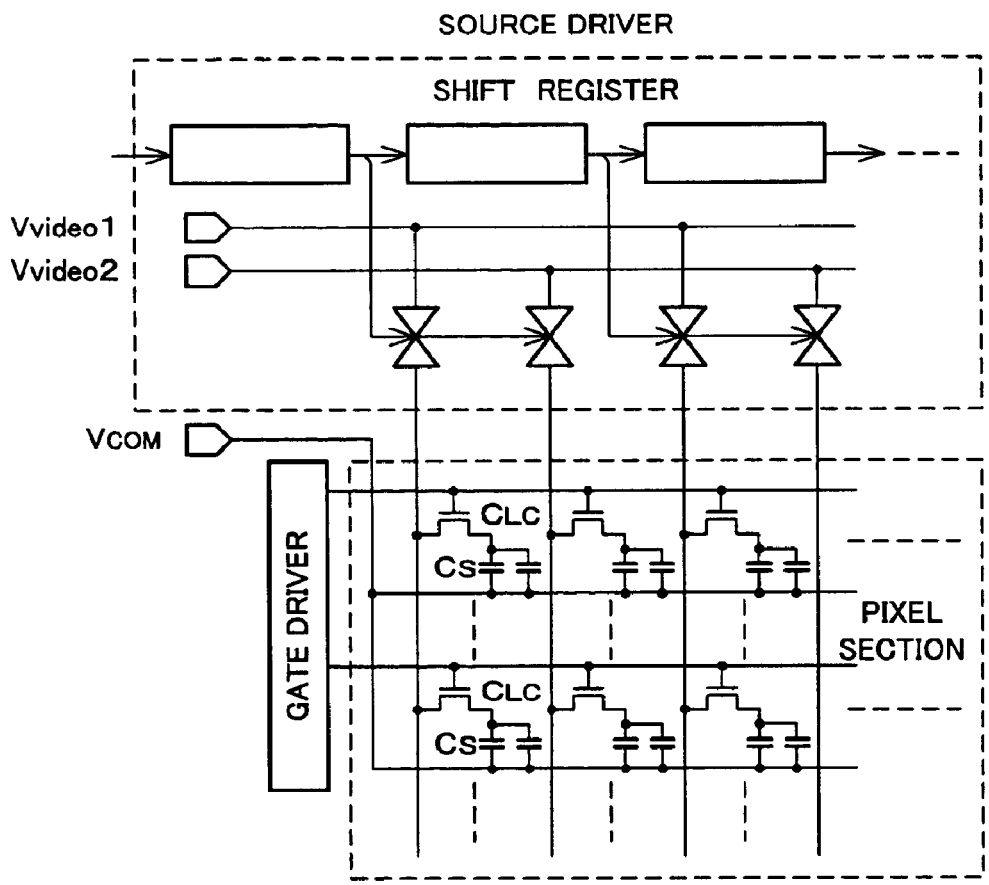
FIG. 11(a) is a circuit diagram schematically showing another conventional liquid crystal display device, and FIG. 11 (b) is a circuit diagram showing a structure of a shift register shown in FIG. 11(a).
Figure 11B:
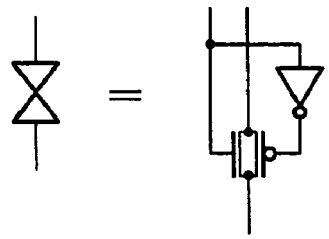
Figure 12:
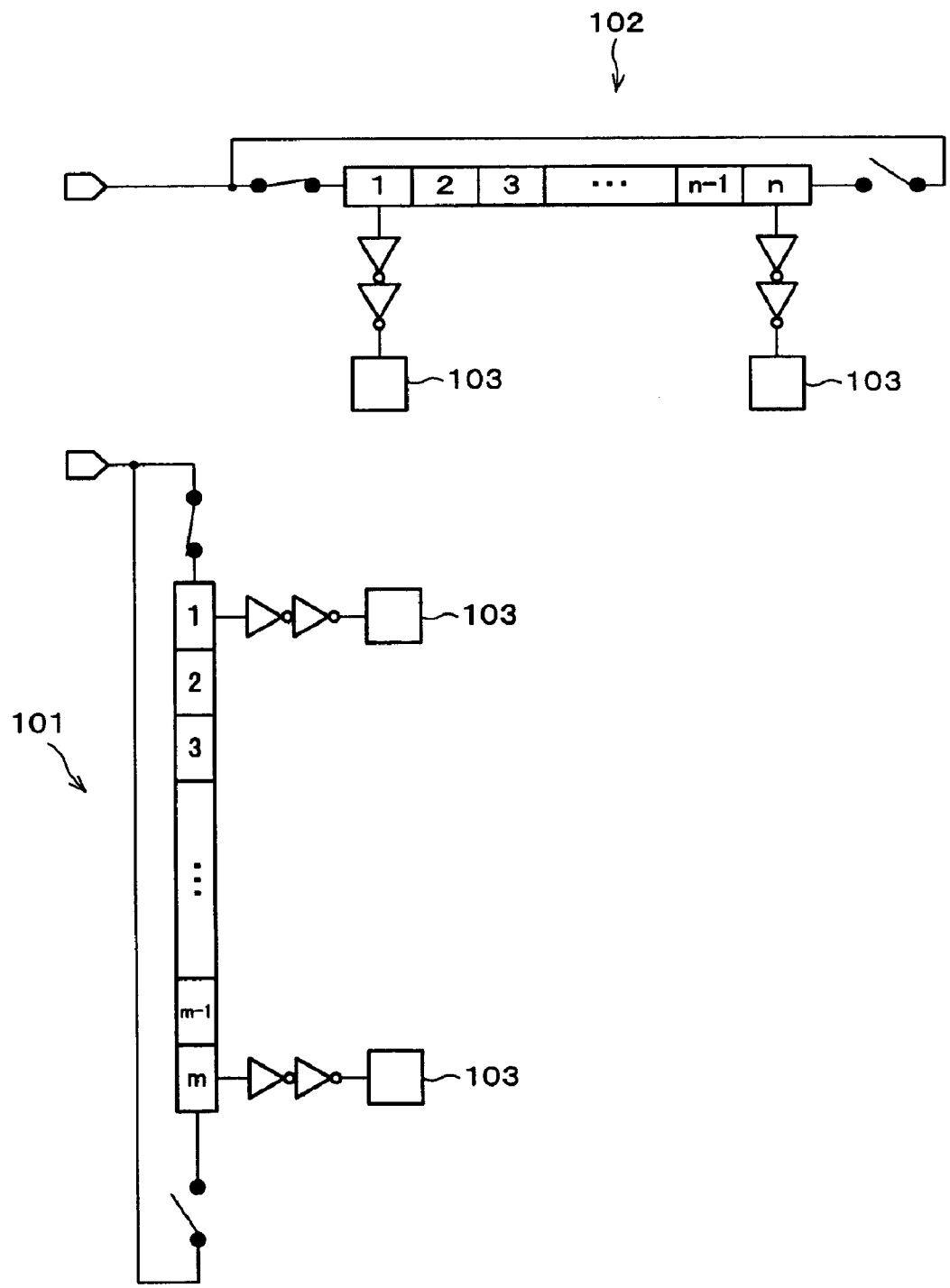
FIG. 12 is a circuit diagram schematically showing a structure of still another conventional liquid crystal display device.

The active-matrix substrate includes, as shown in FIG. 9, a glass substrate (insulating substrate) 90, thin film transistors ("TFTs" hereinafter) 99, pixel electrodes 92, gate lines, data lines, an interlayer insulating film 94, and auxiliary capacitor wiring ("CS wiring" hereinafter) 93.

Each TFT 99 is composed of a gate electrode 91 of the gate line, a data electrode of the data line, a channel layer, an gate insulating film 95, a CG-Si film 98, and metal wiring 100.

Figure 1:
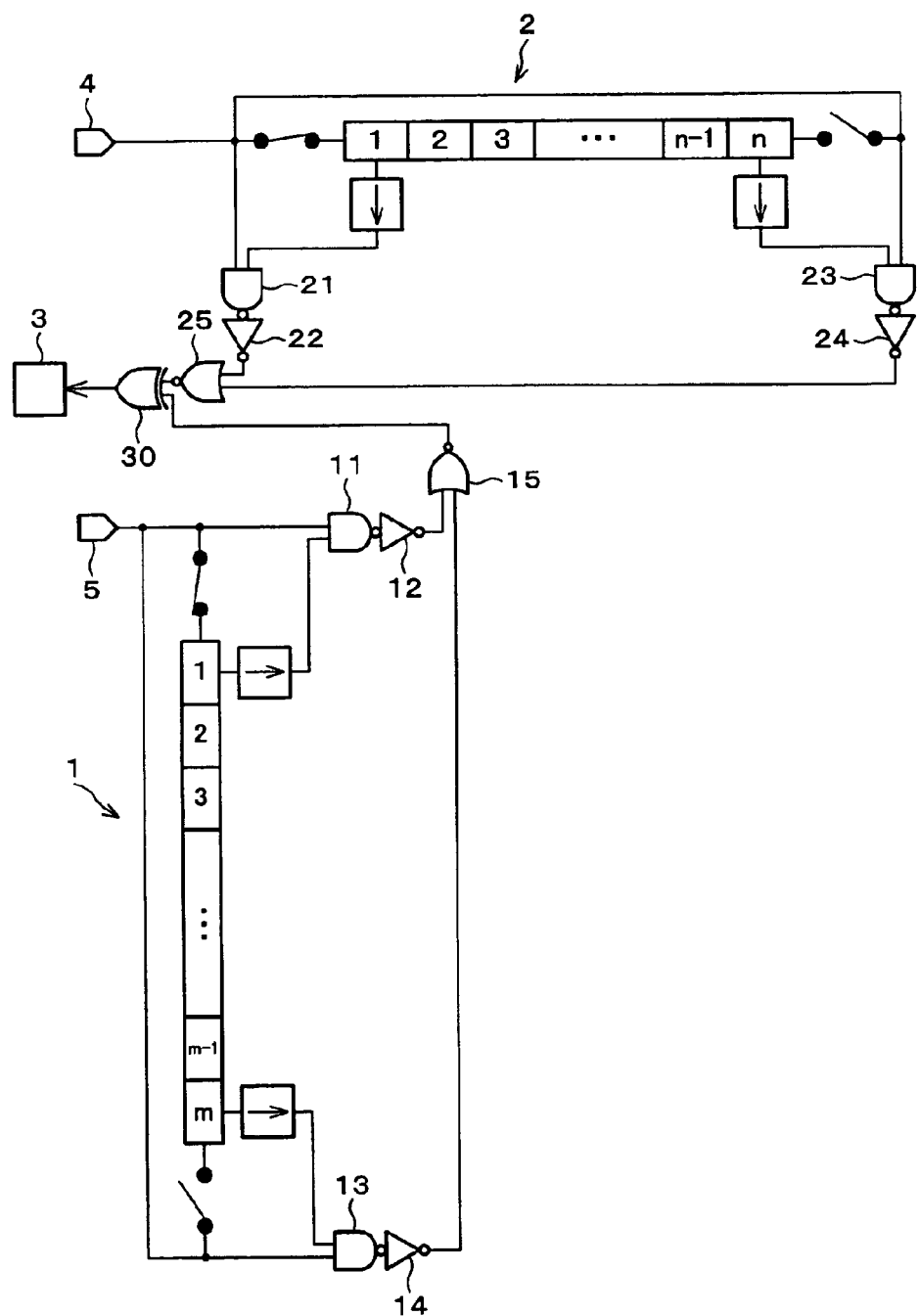
FIG. 1 is a circuit diagram schematically showing a structure of a liquid crystal display device according to one embodiment of the present invention.

On the glass substrate 90, there are monolithically formed, as shown in FIG. 1, a gate driver (driver) 1 having a gate scanning circuit (scanning circuit) connected to the gate lines, and a source driver (driver) 2 having a source scanning circuit (scanning circuit) connected to the data lines. The gate scanning circuit and the source scanning circuit are realized by shift registers.

On the counter substrate are provided counter electrodes, which, together with the pixel electrodes 92, drive a liquid crystal.

Referring to FIG. 9, the following describes a principle of liquid crystal driving.

For image display, the liquid crystal display device sequentially scans display data along the gate lines.

For example, in horizontal scanning of a gate line, an ON gate voltage is applied to the gate line to turn ON the TFTs 99. Here, the other gate lines receive an OFF gate voltage to remain OFF. In this manner, the gate lines are horizontally scanned to turn ON only the TFTs 99 of the gate line being scanned. Here, a signal voltage applied to the data line is supplied to the pixel electrode 92 of the gate line from a source electrode via a drain electrode.

The charge supplied to the pixel electrode 92 is stored in a capacitor. The liquid crystal on each pixel electrode 92 is driven by the potential difference across the pixel voltage applied to the pixel electrode 92 and the counter voltage applied to the counter electrode.

The pixel voltage is held by the capacitor for the duration of single display scanning (one frame period), i.e., until the next gate voltage is applied, so as to drive the liquid crystal. Note that, as the term is used herein, "one frame period" is the period of single vertical scanning of a liquid crystal panel from the top to the bottom of the screen, plus a blanking time before the next frame.

The required pixels are displayed by thus sequentially scanning the gate lines and applying a signal voltage to all data lines according to a state of driving of each pixel.

Referring to FIG. 1, the following describes structures of the gate driver 1 and the source driver 2. The gate driver 1 and the source driver 2 will also be described in relation to a testing method of their gate scanning circuit and the source scanning circuit. Note that, the gate driver 1 and the source driver 2 are capable of bi-directional scanning.

The gate driver 1 and the source driver 2 externally receive signals from an input pad (driving signal input terminal) 5 and an input pad (driving signal input terminal) 4, respectively.

Figure 4:
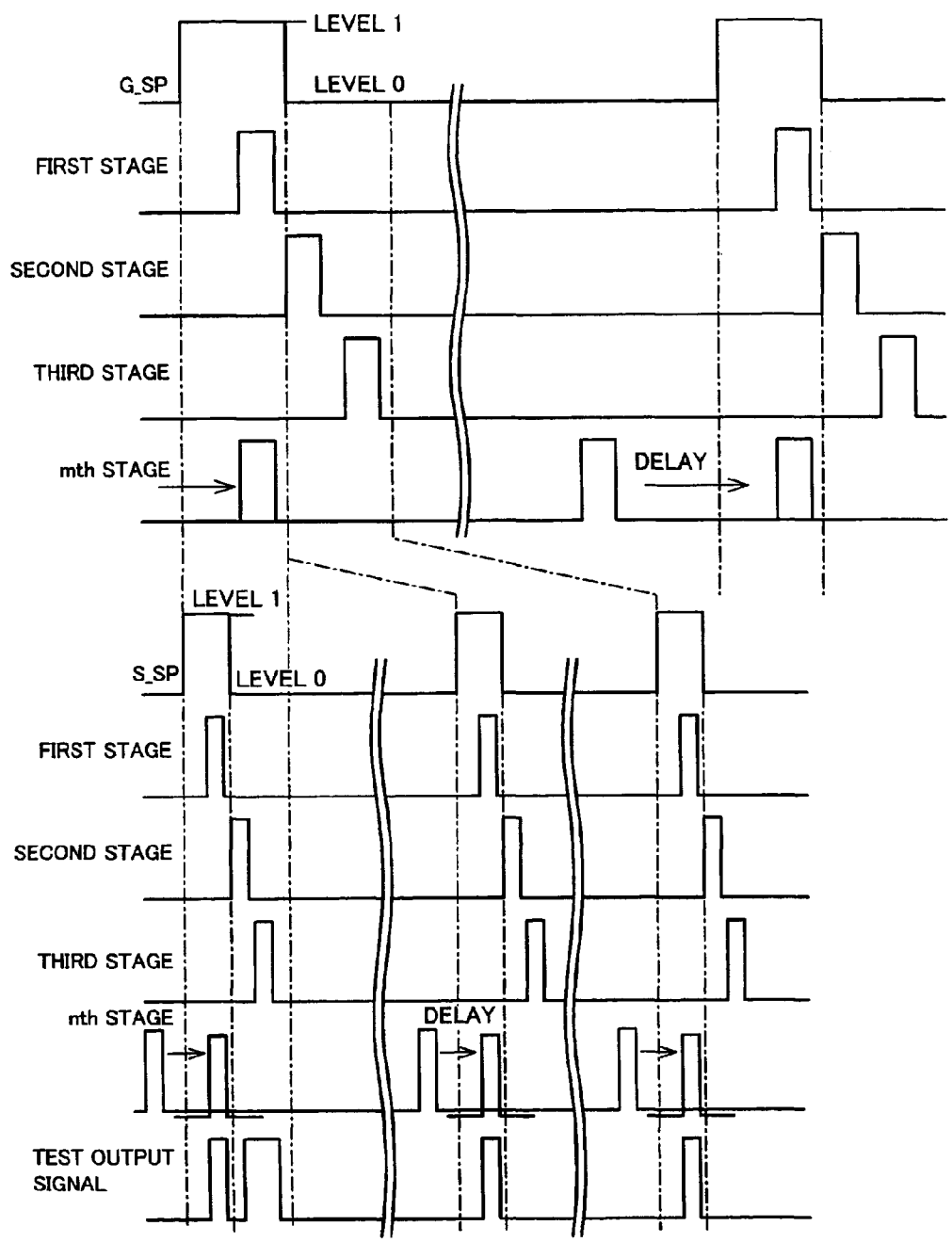
FIG. 4 is a timing chart showing driving operations of a start pulse in a shift direction.

The gate driver 1 receive a clock signal G-CK (CK) and a start pulse G-SP. The start pulse G-SP (SP) is supplied as shift data to the shift registers (scanning circuit) of the gate driver 1 in synchronism with the clock signal G-CK by being shifted through the first stage to the m-th (last) stage. Here, the last stage (m-th stage) of the shift direction outputs the shift data after a predetermined delay, as shown in FIG. 4.

The output of the m-th stage is supplied to a first logic circuit, which is realized by a NAND gate 13 and an inverter 14.

Then, the shift direction is switched (from first direction to second direction) by a scanning direction switching signal, so as to shift the start pulse G-SP as shift data from the m-th stage to the first stage (last stage) of the shift registers in the gate driver 1 in synchronism with the clock signal G-CK. Here, the last stage (first stage) of the shift direction outputs the shift data after a predetermined delay.

The output of the first stage is supplied to a first logic circuit, which is realized by a NAND gate 11 and an inverter 12.

The output (first output) of the inverter 12 and the output (first output) of the inverter 14 are supplied to a second logic circuit, which is realized by an NOR gate 15.

The source driver 2 receives a clock signal S-CK (CK) and a start pulse S-SP (start pulse). The start pulse S-SP (SP) is supplied as shift data to the shift registers of the source driver 2 by being shifted through the first stage to the n-th stage (last stage) of the shift registers. Here, the last stage (n-th stage) of the shift direction outputs the shift data after a predetermined delay, as shown in FIG. 4.

The output of the n-th stage is supplied to a third logic circuit (i.e., first logic circuit that receives the start pulse and the shift data, the shift data corresponding to the start pulse and being the output that is supplied after a predetermined delay from the last stage (n-th stage) of the shift direction), which is realized by a NAND gate 23 and an inverter 24.

Then, the shift direction in the shift registers is switched, so as to shift the start pulse S-SP as shift data from the n-th stage to the first stage (last stage) of the shift registers in the source driver 2 in synchronism with the clock signal S-CK. Here, the last stage (first stage) of the shift direction outputs the shift data after a predetermined delay.

The output of the first stage is supplied to a third logic circuit, which is realized by a NAND gate 21 and an inverter 22.

The output (third output) of the inverter 22 and the output (third output; N.B., the output of the inverter 24 is the first output when the first logic circuit is realized by the NAND gate 23 and inverter 24) of the inverter 24 are supplied to a fourth logic circuit, which is realized by an NOR gate 25 (N.B., the NOR gate 25 is the second logic circuit when the first logic circuit is realized by the NAND gate 23 and inverter 24, and the output of the second logic circuit is the second output in this case).

The output (second output) of the NOR gate and the output (fourth output) of the NOR gate 25 are supplied to a fifth logic circuit, which is realized by an EX-OR (Exclusive OR) circuit 30. The output (fifth output, test output signal) of the EX-OR circuit 30 is supplied to a testing pad (testing terminal) 3 for external use.

That is, in the gate driver 1 and the source driver 2, which are adapted to bi-directional scanning, the output of the NOR gate from the gate driver 1 and the output of the NOR gate from the source driver 2 are supplied to the EX-OR circuit 30. The output of the EX-OR circuit 30 is fed to the testing pad 3, which is disposed side by side with ordinary input pads 4 and 5.

In order to find whether the scanning circuits are operating normally, a probe stylus is brought into contact with the testing pad 3 to observe whether there is a difference in logic level between the output (last output) of the testing pad 3 at a predetermined timing and the outputs before and after this timing. For example, the scanning circuits are tested normal when the output logic level is 1 at a predetermined timing and is 0 at other timings.

The operating states (normal or abnormal) of the scanning circuits can also be found by other methods, for example, by directly bringing a probe stylus into contact with the outputs of the NOR gates 15 and 25.

Alternatively, the operating states of the scanning circuits may be found by directly observing the respective outputs of the NAND gate 11 or 13 and the NAND gate 21 or 23, or of the inverter 12 or 14 and the inverter 22 or 24. This is also applicable to drivers that do not accommodate bi-directional scanning.

The logic elements of the logic circuits may be combined in any ways so long as the same logic can be attained in the end. Further, not limited to the positive logic, the logic circuits can operate in the same manner with respect to the negative logic as well.

Figure 2:
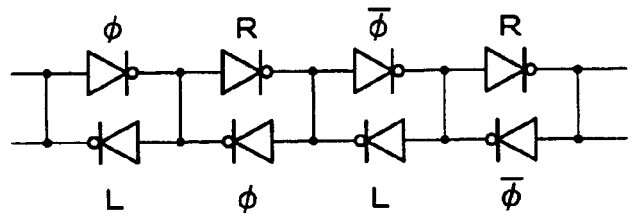
FIG. 2 is a circuit diagram showing a structure of shift registers.

The bi-directional scanning of the gate driver 1 and the source driver 2 is realized by the shift registers of a structure shown in FIG. 2. In FIG. 2, R is the shift direction from the left to right, L is the shift direction from the right to left, and φ is a control signal.

The input start pulse SP is shifted with half the period of the clock signal CK, and the pulse width of the output shift data is the period of the clock signal CK. Under normal conditions, the pulse width of the output shift data is set to half the period of the clock signal CK, by providing a NAND gate or a frequency demultiplier circuit between adjacent outputs, so as to avoid overlap of adjacent pulses.

In order to delay the output from the last stage of the shift registers by a predetermined amount of time with respect to the shift direction of the shift data, a delaying circuit is provided. The delaying circuit can be realized by shift registers, for example, with the shift registers shown in FIG. 2. The number of shift registers in the delaying circuit is selected according to the amount of delay required.

It should be noted that bi-directional scanning can also be realized, other than using the above shift registers, using flip-flops by switching their input and output with an analog switch.

Further, the gate driver 1 and the source driver 2 are not necessarily required to accommodate bi-directional scanning, and use of gate driver 1 and source driver 2 that are capable of only unidirectional scanning is also possible.

Referring to FIG. 9, the following describes an example of a fabrication process of the active-matrix substrate.

First, an a-Si layer is deposited over the entire surface of, for example, the glass substrate 90 having an insulating property. In order to render the Si surface hydrophilic, an oxide film is formed thereon and an aqueous solution of nickel acetate is spin-coated on the oxide film.

Then, after solid-state growth for 12 hours at 600° C., a SiO$_2$ film is deposited and the oxide film is removed from the region other than the area to be the active region of the device.

Thereafter, using the oxide film as a mask, concentrated P+ ions are implanted (15 keV, $5\times10^{15}$ cm$^{-2}$) in portions of the poly-Si layer and a heat treatment is carried out at 600° C. for 12 hours. Next, the SiO$_2$ film is removed and another SiO$_2$ film is deposited on the Si surface. Then, an oxidation process is carried out for about 30 minutes in an oxidative atmosphere containing hydrochloric acid for about 2 hours at 950° C. Thereafter, the Si film, which became unnecessary, is removed from the region other than the area to be the active region of the device.

With the active-matrix substrate fabricated this way, the TFTs and the scanning circuits of the gate and source drivers 1 and 2 contain continuous grain silicon, which is polycrystalline silicon that results from crystalline growth promoted by a metal catalyst.

The rest of the process is the same as that commonly used in forming ordinary polycrystalline silicon TFTs. Namely, the following elements are formed in order of appearance: The gate insulating film 95, the gate electrodes, N+ (P+ ion) and P+ (B+ ion) implantation, a planarizing film 97 containing SiO$_2$ and BPSG, a contact hole 97a, the metal (AlSi) wiring 100, a SiNx film 96, the interlayer insulating film 94 made of SiO$_2$, a light shielding film, a via hole 94a, and the pixel electrodes 92 as transparent electrodes made of ITO or IZO. As a result, the scanning circuits and the TFTs 99 of the display section are formed.

Note that, the BPSG in the planarizing film 97 may be a resin such as acrylic resin or polyimide.

The TFTs 99, which are made of continuous grain silicon (CG-Si) that results from crystallization promoted by a metal catalyst, have mobility about 2 to 2.5 times greater than that of conventional high-temperature polycrystalline silicon TFT of about 100 cm$^2$/V·sec.

Note that, other than CG-Si, p-Si (polycrystalline silicon) may be used to fabricate the TFTs and the scanning circuits of the gate and source drivers 1 and 2. Testing of the scanning circuits can be carried out equally well with p-Si.

Figure 3A:
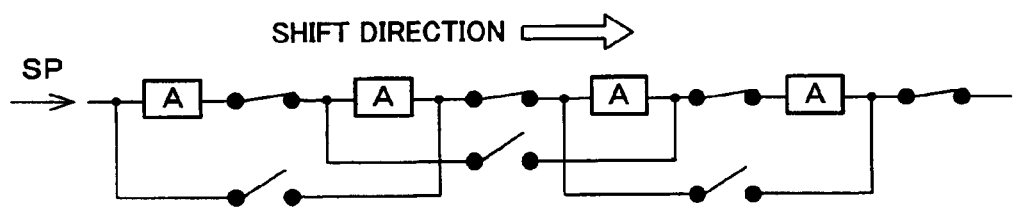
FIG. 3(a) is a circuit diagram showing a structure of a clocked latch.
Figure 3A:
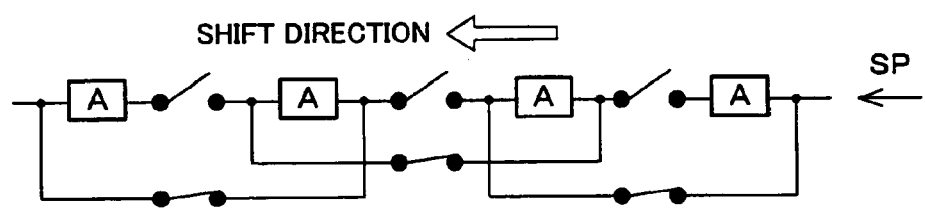
Figure 3B:
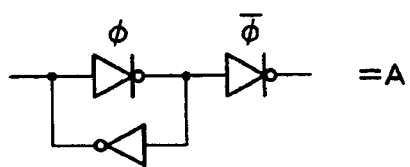
FIG. 3(b) is a circuit diagram showing a structure of A in FIG. 3(a).
Figure 5:
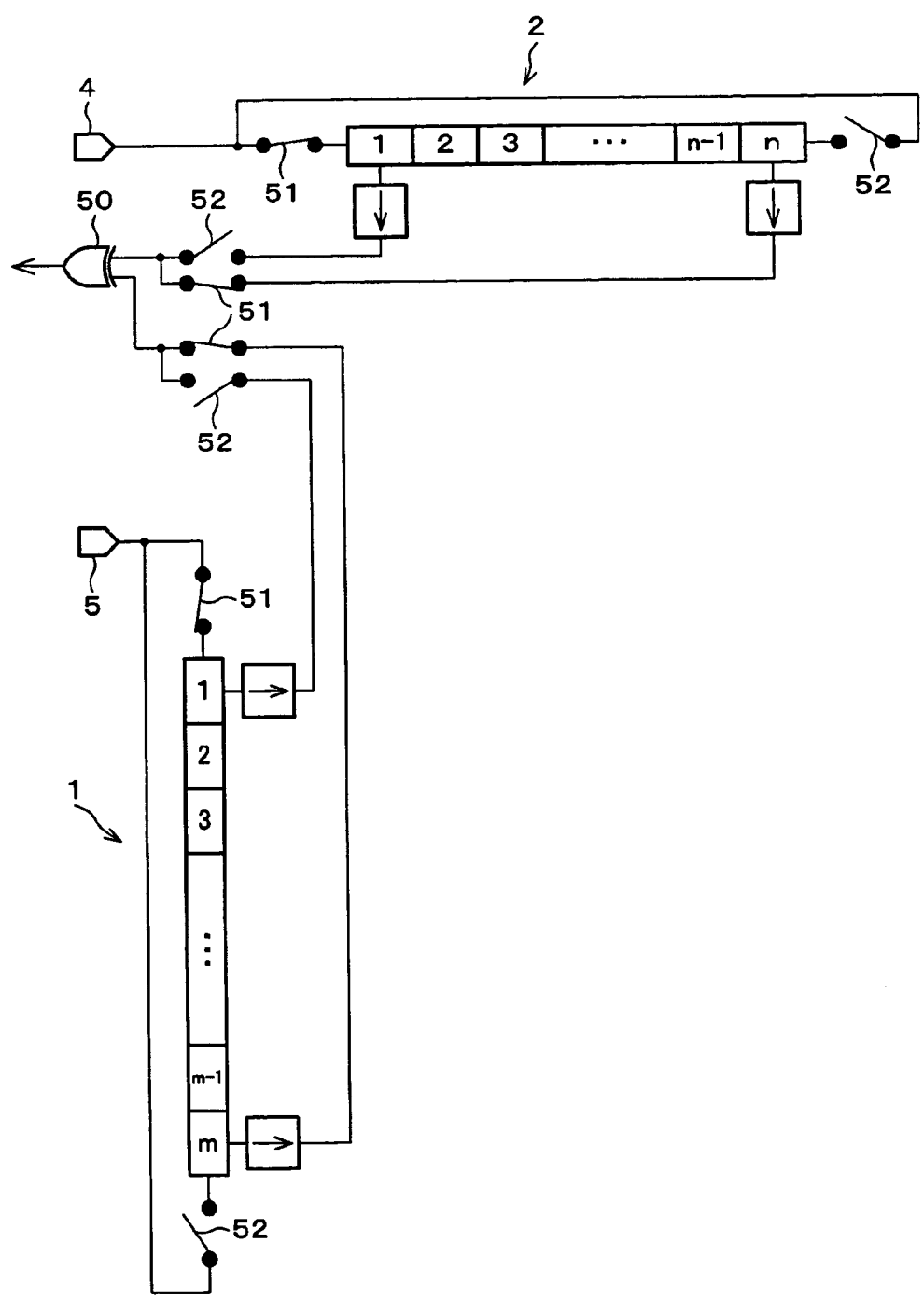
FIG. 5 is a circuit diagram showing a structure in which analog switches are used to switch shift directions.

Further, the scanning directions (shift directions) in the bi-directional scanning of the gate and source drivers 1 and 2 may be switched by switching the direction (left or right) of the signal into the clocked inverter, or by changing the settings of the analog switches, as shown in FIG. 2 or FIG. 3(a) and FIG. 3(b). The input and output stages may be switched using analog switches 51 and 52, as shown in FIG. 5.

The analog switches 51 and 52 are provided so that either analog switches 51 or analog switches 52 are selected and closed according to a scanning direction switching signal from an electrical circuit section.

With the analog switches 51 closed, the gate driver 1 shifts the start pulse G-SP as shift data from the first to m-th (last) stages. In the source driver 2, the start pulse S-SP is shifted as shift data from the first to n-th (last) stage.

The output of the m-th stage of the gate driver 1 and the output of the n-th stage of the source driver 2 are supplied to the EX-OR circuit (logic circuit) 50, where logical operations are performed.

The operating states of the gate scanning circuit and the source scanning circuit are judged normal when the output of the EX-OR circuit 50 after a predetermined elapsed time from the input of the start pulse S-SP or G-SP is 1 and when the outputs before and after this timing is 0.

As with the analog switches 51, closing the analog switches 52 initiates the same logical operations except the scanning direction is reversed, so as to test the scanning circuits.

Figure 6:
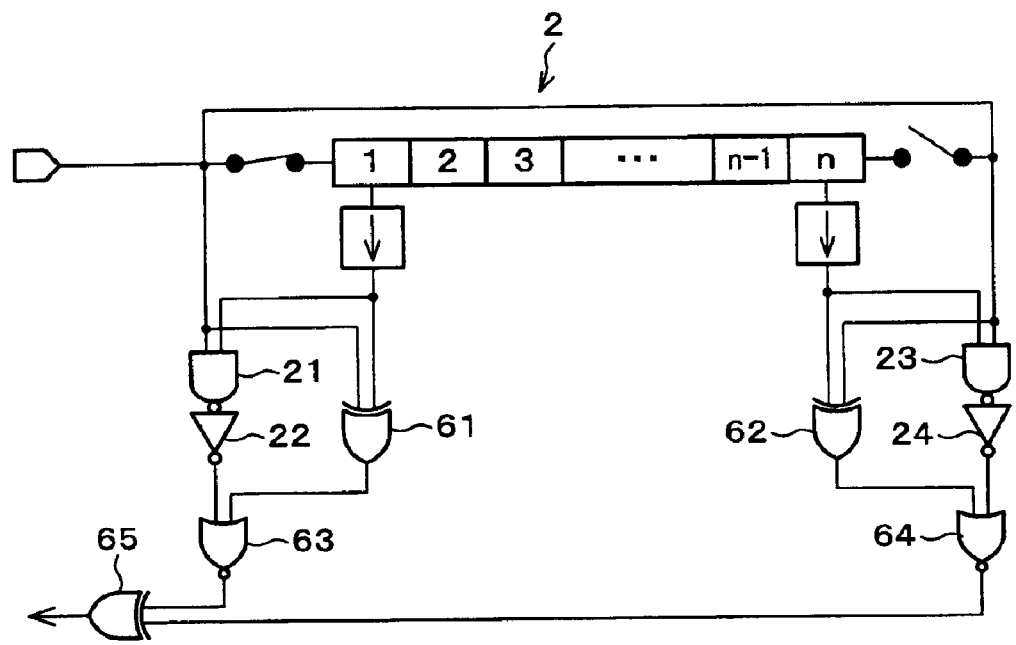
FIG. 6 is a circuit diagram in which an NOR gate and an EX-OR circuit are additionally connected in the source driver of FIG. 1.

Alternatively, the scanning circuits may be tested with a structure shown in FIG. 6. Namely, an EX-OR circuit 61 and an EX-OR circuit 62 are connected parallel to the NAND gate 21 and the inverter 22 and to the NAND gate 23 and the inverter 24 of FIG. 1, respectively, wherein the output of the inverter 22 and the output of the EX-OR circuit 61 are supplied to an NOR gate 63, and the output of the inverter 24 and the output of the EX-OR circuit 62 are supplied to an NOR gate 64, so as to supply the respective outputs of the NOR gate 63 and the NOR gate 64 to an EX-OR circuit 65.

By thus testing the scanning circuits, malfunction of the gate scanning circuit and/or source scanning circuit can be detected by detecting the output of a predetermined value (for example, "1") at timings that should produce a different value.

The foregoing embodiment described the case where the display device is the liquid crystal display device. However, the present invention is not just limited to the liquid crystal display device and the described advantages can also be obtained using other types of display devices, including display devices using electrophoretic or organic EL (electroluminescence) light emitting diodes.

The output signals of the scanning circuits may be divided using a multiplexer. In this way, a smaller space will be required and the number of shift register stages can be reduced. In addition, testing of the scanning circuits can be carried out over a wider area.

The scanning circuits may be additionally provided with phase difference detecting means for detecting a phase difference of the input start pulse and the corresponding shift data that is outputted from the last stage of the shift registers in the shift direction.

In this way, the scanning circuits can be accurately tested using the start pulse and the shift data that is outputted from the last stage of the shift direction after a predetermined delay.

[Second Embodiment]

Another embodiment of the present invention is described below with reference to FIG. 7. Note that, constituting elements that are functionally equivalent to those described in the First Embodiment are given the same reference numerals and explanations thereof are omitted here.

Figure 7:
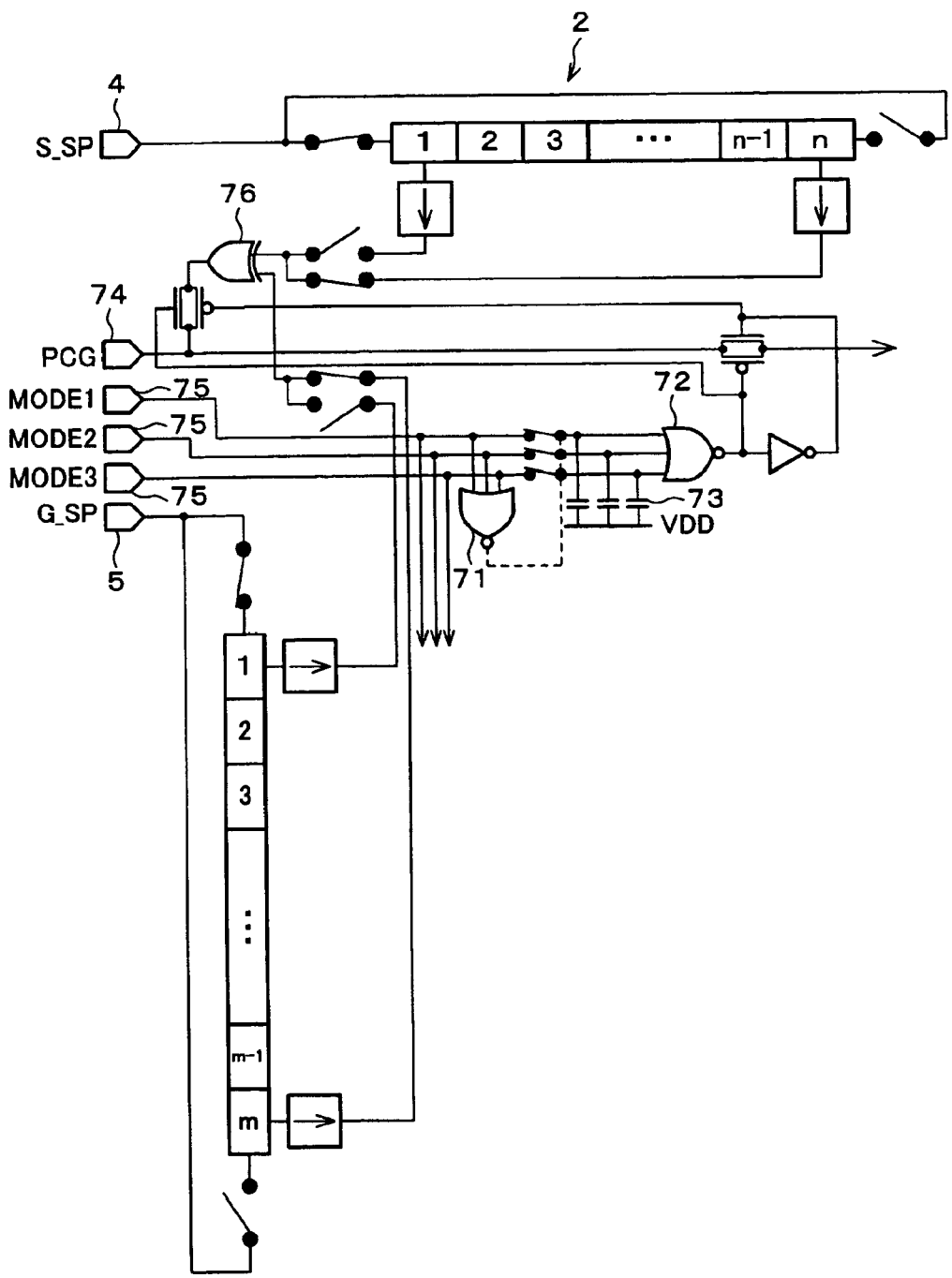
FIG. 7 is a circuit diagram schematically showing a liquid crystal display device according to another embodiment of the present invention.

As with the structure shown in FIG. 1 described in the First Embodiment, a liquid crystal display device of the present embodiment has gate and source drivers 1 and 2 that are capable of bi-directional shifting, and input pads 4 and 5, as shown in FIG. 7.

The gate and source drivers 1 and 2 output signals from the last stages with respect to the shift directions. The output signal of each driver in either shift direction is selected by analog switches in response to input of a scanning direction switching signal.

The selected output signal is supplied to an EX-OR circuit 76 with or without delay.

The present embodiment uses three kinds of image display formats (display modes), which are switched according to three kinds of display mode switching signals (MODE 1 signal, MODE 2 signal, MODE 3 signal) (MODE 1, MODE 2, MODE 3 in FIG. 7). In this example, the three kinds of display mode switching signals, when they are supplied to their respective input pads 75 in a combination of 0, 0, 0, branch off in the wiring of the display mode switching circuit and enter a 3-input NOR gate (second NOR gate) 72 from the respective terminals, so as to effect a test mode.

Table 1 below indicates an example of combinations of the three kinds of display mode switching signals.

TABLE 1

|  | MODE 1 SIGNAL | MODE 2 SIGNAL | MODE 3 SIGNAL |
| --- | --- | --- | --- |
| MODE 1 | 1 | 1 | 1 |
| MODE 2 | 0 | 1 | 1 |
| MODE 3 | 1 | 0 | x |
| TEST | 0 | 0 | 0 |

In Table 1, "0" and "1" are display switching DC levels of the MODE 1 signal, MODE 2 signal, and MODE 3 signal. Indicated by "x" is the presence of a pulse signal, for example, during the blanking period. In the test mode, for example, all scanning outputs for the top and bottom areas (non-display areas) of the screen become ON (H). In response, the pixels display black in response to applied display data.

More specifically, in the test mode, the three kinds of display mode switching signals are supplied to the NOR gate 72 via analog switches that are driven by the outputs of the NOR gate 71 (first NOR gate).

The output of the NOR gate 72 disconnects a PCG (pre-charge control signal) from a signal line that does not affect operations of the scanning circuits (here, pre-charge control line). Instead, the output of the EX-OR circuit 76 is connected to an input terminal 74 of the pre-charge control line via an analog switch.

Each input of the NOR gate 72 is connected to a capacitor (non-auxiliary capacitor) 73 of a small size for memory use. The capacitor 73 has enough capacitance to maintain the state of test mode even after one of the input pads 75 receives "1" and the NOR gate 72 is disconnected from the three kinds of display mode switching signals by the operations of the analog switches. After a sufficient lapse of time, the test mode automatically reverts to a normal operation mode (MODE 1, 2, or 3).

The output of the EX-OR circuit 76 is automatically fed to the input terminal 74 only in the test mode. The operating states (normal or abnormal) of the scanning circuits can be found by observing signals that are generated when a probe stylus is brought into contact with the input terminal 74, so as to find whether the output of the EX-OR circuit 76 is "1" at a predetermined timing and "0" at other timings. Namely, malfunction of the scanning circuits can be confirmed when "0" is found at a timing when "1" should be generated, and vice versa.

In this way, the operating states of the scanning circuits can be tested without additionally providing a testing terminal.

This makes it possible to test operating states of the scanning circuits surely and quickly, even when there is not enough space for a new terminal, as in small and fine resolution panels, mobile devices, and small and fine resolution liquid crystal display devices for projection use, in particular.

Note that, combinations of the display mode switching signals are not just limited to the example of the present embodiment and any combination is possible.

[Third Embodiment]

Yet another embodiment of the present invention is described below with reference to FIG. 8. Note that, constituting elements that are functionally equivalent to those described in the First Embodiment are given the same reference numerals and explanations thereof are omitted here.

Figure 8:
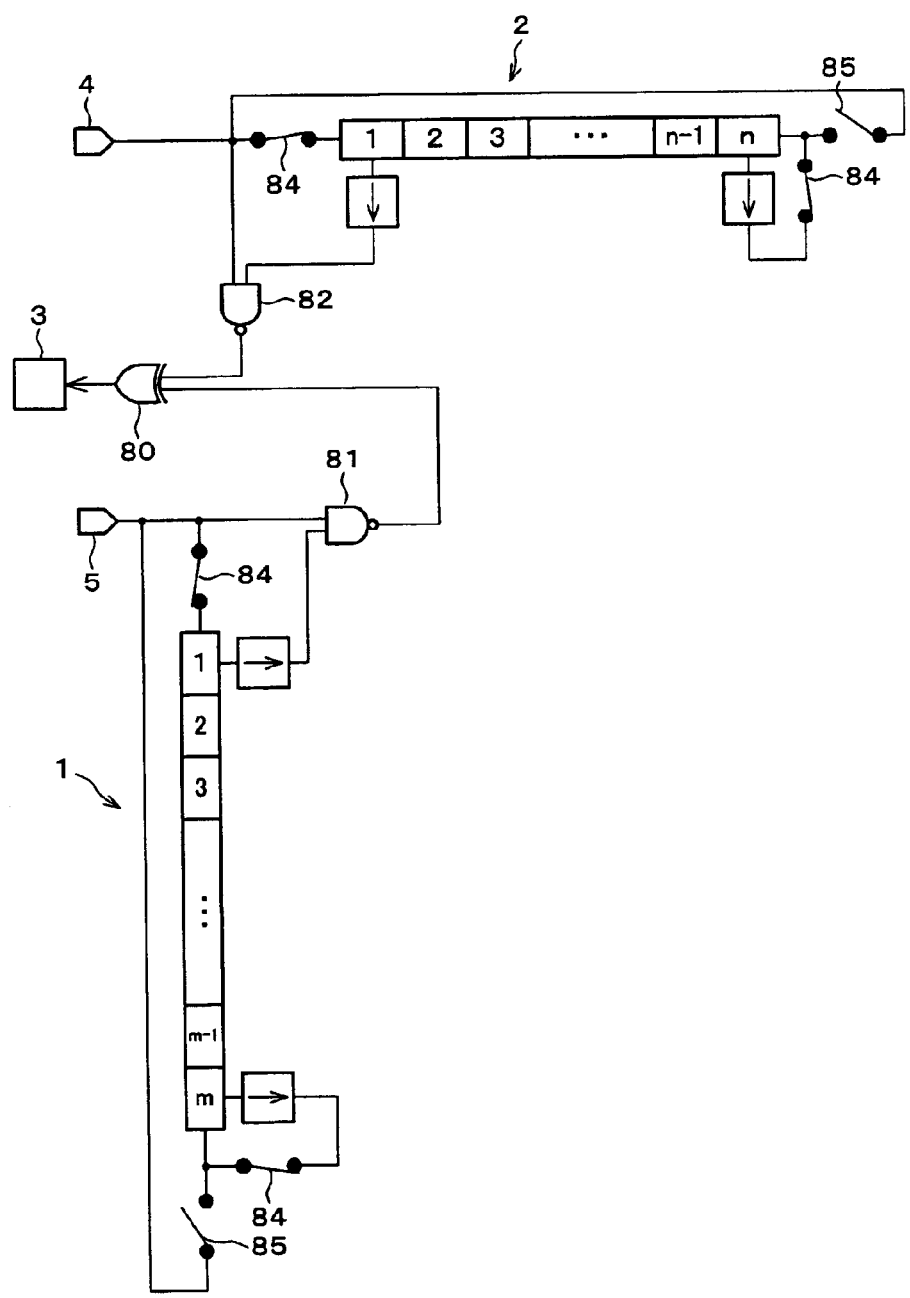
FIG. 8 is a circuit diagram schematically showing a liquid crystal display device according to yet another embodiment of the present invention.

As with the structure shown in FIG. 1 described in the First Embodiment, a liquid crystal display device of the present embodiment includes gate and source drivers 1 and 2 that are capable of switching shift directions, in addition to a testing pad 3 and input pads 4 and 5, as shown in FIG. 8.

In response to input of the clock signal G-CK and the start pulse G-SP, the gate driver 1, with its shift direction set in the first direction, shifts the start pulse G-SP as shift data from the first to m-th (last stage of the first direction) stages of the shift registers in synchronism with the clock signal G-CK. Here, a switch 84 is closed and a switch 85 is open. The switch 84 is open and the switch 85 is closed when scanning in the reverse direction and when no testing is carried out.

The output of the m-th stage is temporarily latched by holding it in a latch circuit. With the first shift direction reversed to the second direction, the output signal latched in the latch circuit is used as an input signal and the gate driver 1 successively shifts this input signal as shift data from the m-th to first (last) stages of the shift registers (the first stage being the last stage of the second direction) in synchronism with the clock signal G-CK.

The shift data transferred to the last (first) stage is temporarily latched in the latch circuit, and, with the next start pulse G-SP, supplied to an NAND gate 81, where logical operations are carried out.

Similarly in the source driver 2, the shift data transferred to the n-th stage and temporarily latched is transferred again as an input signal to the first stage. The shift data transferred to the first stage is temporarily latched, and, with the next start pulse S-SP, supplied to an NAND gate 82, where logical operations are carried out.

The output of the NAND gate 81 and the output of the NAND gate 82 are supplied to an EX-OR circuit 80, where logical operations are carried out.

The operating states of the scanning circuits can be tested by detecting whether the output of the EX-OR circuit 80 is "1" at a predetermined timing and "0" at other timings. That is, malfunction of the scanning circuits can be confirmed when "0" is found at a timing when the output should be "1", and vice versa.

Note that, the shift data from the m-th stage and the shift data from the n-th stage are temporarily latched at the timings according to horizontal and vertical blanking. Accordingly, it is not necessarily required to temporarily latch the shift data from these shift register stages when there is no blanking period.

Alternatively, the operating states of the scanning circuits may be tested by comparing the shift data with the start pulse, instead of using the NAND gates 81 and 82.

As described, a display device (for example, liquid crystal display device) of the present invention includes: a gate driver for line-sequentially selecting pixels that are disposed in a matrix, so as to scan the pixels; a source driver for supplying a data signal to the pixels of a selected line; and a substrate, at least one of the gate driver and the source driver being monolithically formed on the substrate, wherein: the gate driver and the source driver each comprises a scanning circuit, and the scanning circuit of at least one of the gate driver and the source driver monolithically formed on the substrate periodically receives a clock signal and a start pulse, the start pulse having a certain width and being shifted as shift data in the scanning circuit in synchronism with the clock signal, and the start pulse is supplied to a first logic circuit with an output that is supplied after a predetermined delay from a last stage of the scanning circuit with respect to a shift direction of the shift data corresponding to the start pulse, so as to test the scanning circuit using a first output from the first logic circuit (see FIG. 1).

According to this arrangement, the start pulse and the shift data are used to test the scanning circuit, where the shift data is the output that is supplied after a predetermined delay from the last stage of the scanning circuit with respect to the shift direction.

In this way, because the pulse with a certain width is used as a test signal for logical operations, other pulses are prevented from being recognized as the test signal.

This ensures that the scanning circuit is judged properly. Namely, it is possible to judge whether the scanning circuit is operating properly.

Further, by monolithically forming the driver on the substrate, the scanning circuit of the driver (driving circuit) can be formed in the same process of forming the switching elements. This eliminates the need to additionally forming the driver LSI, for example, and thereby reduces manufacture cost and the number of installation steps.

It is preferable in the display device that at least one of the gate driver and the source driver monolithically formed on the substrate comprises switching means for switching shift directions of the shift data, the clock signal and the start pulse being supplied to the scanning circuit of at least one of the gate driver and the source driver monolithically formed on the substrate, and the first output in each shift direction is supplied to a second logic circuit, so as to test the scanning circuit using a second output from the second logic circuit.

According to this arrangement, it is ensured that the scanning circuit is judged in either direction.

Another display device of the present invention includes: a gate driver for line-sequentially selecting pixels that are disposed in a matrix, so as to scan the pixels; a source driver for supplying a data signal to the pixels of a selected line, and a substrate, the gate driver and the source driver being monolithically formed on the substrate, wherein: the gate driver and the source driver each comprises a scanning circuit that has switching means for switching shift directions, the scanning circuit periodically receiving a clock signal and a start pulse, the start pulse having a certain width and being shifted as shift data in the scanning circuit in synchronism with the clock signal, and the start pulse supplied to the scanning circuit of the gate driver in each shift direction is supplied to a first logic circuit with an output that is outputted after a predetermined delay from a last stage of the scanning circuit of the gate driver with respect to the shift direction of the shift data corresponding to the start pulse, the first logic circuit supplying a first output to a second logic circuit with respect to each shift direction, and wherein: the start pulse supplied to the scanning circuit of the source driver in each shift direction is supplied to a third logic circuit with an output that is supplied after a predetermined delay from a last stage of the scanning circuit of the source driver with respect to the shift direction of the shift data corresponding to the start pulse, the third logic circuit supplying a third output to a fourth logic circuit with respect to each shift direction, and the second logic circuit and the fourth logic circuit respectively supply a second output and a fourth output to a fifth logic circuit, and the fifth logic circuit supplies a fifth output that is used to test the scanning circuits of the gate driver and the source driver.

According to this arrangement, because the pulse with a certain width is used as a test signal for logical operations, other pulses are prevented from being recognized as the test signal.

This ensures that the scanning circuit is judged properly. Namely, it is possible to judge whether the scanning circuit is operating properly.

In addition, the scanning circuit can be judged properly, for example, even in devices such as small and fine resolution panels, mobile devices, and small and high resolution display devices for projection use, without increasing the area or complexity of the circuit.

It is preferable that the display device further includes a testing terminal that is connected to the fifth output.

According to the foregoing arrangement, one or more or all of the outputs from the last stage of the scanning circuit can be supplied as one signal to a single testing terminal (for example, pad) through the simple logic circuit. This enable the scanning circuit to be readily judged, for example, by bringing a probe stylus into the testing terminal.

Yet another display device of the present invention includes: a gate driver for line-sequentially selecting pixels that are disposed in a matrix, so as to scan the pixels; a source driver for supplying a data signal to the pixels of a selected line, and a substrate, the gate driver and the source driver being monolithically formed on the substrate, wherein: at least one of the gate driver and the source driver comprises: switching means for switching shift directions; and an analog switch for selecting a start pulse or an output from a last stage of either shift direction, the gate driver and the source driver each having a scanning circuit that periodically receives a clock signal and the start pulse in each shift direction, the start pulse having a certain width and being shifted as shift data in the scanning circuit in synchronism with the clock signal, and the output from the last stage of the scanning circuit is supplied to a logic circuit, and the logic circuit outputs a signal that is used to test the scanning circuits (see FIG. 5).

According to this arrangement, because the pulse with a certain width is used as a test signal for logical operations, other pulses are prevented from being recognized as the test signal.

This ensures that the scanning circuit is judged properly with a simple structure in either shift direction. Namely, it is possible to judge whether the scanning circuit is operating properly.

It is preferable in the display device that the scanning circuit is tested to judge an operating state of the scanning circuit, by detecting the last output of the scanning circuit and the logic circuit for testing after a predetermined time period from the input of the start pulse.

Namely, it is preferable that the scanning circuit is judged normal when the last output after a predetermined time period from the input of the start pulse has a predetermined value different from the values of the last output before and after this timing.

Specifically, the first logic circuit is composed of an NAND gate and an inverter, and the second logic circuit is composed of an NOR gate, and the scanning circuit is judged normal when the second output after a predetermined time period from the input of the start pulse is 1 or 0 and when the second output before and after this timing is 0 or 1, with respect to the output, 0 or 1, from the last stage of the scanning circuit in the shift direction of the start pulse.

According to this arrangement, the logic circuit, with its simple judging function, can judge the scanning circuit according to the value of the output that is supplied at a predetermined timing.

Accordingly, the scanning circuit can be judged both quickly and accurately.

It is preferable that the display device further includes delaying means for delaying the output from the last stage of the scanning circuit with respect to the shift direction for a predetermined time period, so as to shift the output through a predetermined number of stages.

According to this arrangement, the scanning circuit can be judged with a simple structure using the start pulse and the shift data, where the shift data is the output that is supplied after a predetermined delay from the last stage of the scanning circuit in the shift direction.

It is preferable in the display device that the delaying means is a shift register.

According to this arrangement, the scanning circuit can be judged in either direction with a simple structure.

It is preferable in the display device that the logic circuit is an exclusive OR circuit and the scanning circuit is judged normal when the output signal from the logic circuit after a predetermined time period from the input of the start pulse has a value 1 and when the output signal before and after this timing has a value 0.

According to this arrangement, the scanning circuit can be judged according to the value of the output that is supplied at a predetermined timing.

Accordingly, the scanning circuit can be judged both quickly and accurately.

It is preferable that the display device further includes: a plurality of display modes that are switchable according to input of display mode switching signals, wherein, in response to input of a particular combination of the display mode switching signals, the output signal from the logic circuit is supplied to a signal terminal of signal wiring that has no influence on operations of the scanning circuit and a signal intended for the signal wiring is disconnected therefrom, so as to judge an operating state of the scanning circuit, using the output signal that is supplied at a predetermined timing (see FIG. 7).

According to this arrangement, the judging mode of the scanning circuit can be effected according to combinations of the display mode switching signals. In addition, the scanning circuit can be judged according to the output that is supplied at a particular timing.

Accordingly, the scanning circuit can be judged with a simple structure. Namely, it is possible to judge whether the scanning circuit is operating properly.

It is preferable that the display device further includes: a first NOR gate, which receives the display mode switching signals; and a second NOR gate, which receives an output of the first NOR gate only when the display mode switching signals are all 0, wherein: after the display mode switching signals are supplied from the first NOR gate to the second NOR gate and all inputs to the second NOR gate are pulled up using an analog switch that is driven by the output and the inverted output of the first NOR gate when the output of the first NOR gate is 0, the second NOR gate, by being disconnected from the analog switch, causes a capacitor to hold an input state of the second NOR gate for a certain time period with respect to any combination of the display mode switching signals.

According to this arrangement, the operations of the scanning circuit can be tested without additionally providing a testing terminal.

This enables the scanning circuit to be judged, both quickly and accurately, even when only a small space can be provided for the new terminal, as in various types of small devices, including small and fine resolution panels, mobile devices, or small and fine resolution liquid crystal display devices for projection use, in particular.

Still another display device of the present invention includes: a gate driver for line-sequentially selecting pixels that are disposed in a matrix, so as to scan the pixels; a source driver for supplying a data signal to the pixels of a selected line, and a substrate, at least one of the gate driver and the source driver being monolithically formed on the substrate, wherein: at least one of the gate driver and the source driver monolithically formed on the substrate comprises switching means for switching shift directions, at least one of the gate driver and the source driver monolithically formed on the substrate each having a scanning circuit that periodically receives a clock signal and the start pulse in each shift direction, the start pulse having a certain width and being shifted as shift data in the scanning circuit in synchronism with the clock signal, the switching means switching the shift directions from a first direction to a second direction after the start pulse has been shifted in the first direction and transferred to a last stage of the first direction, the shift data transferred to the last stage of the first direction being shifted in the second direction in synchronism with the clock signal, by being temporarily held in a latch circuit or by being directly supplied to the scanning circuit as data to be shifted in the second direction, the shift data transferred to a last stage of the second direction (i.e., input stage of the first direction) being used to test the scanning circuit (see FIG. 8).

According to this arrangement, the signal that is used to judge the scanning circuit is spatially returned to the input side of the shift data. This makes it possible to judge the scanning circuit. Namely, the scanning circuit can be judged whether it is operating properly in either direction. Further, unnecessary terminals or long signal wiring that are otherwise required can be eliminated to avoid complex wiring.

It is preferable in the display device that an operating state of the scanning circuit is judged by comparing, or supplying to a judging logic circuit, the shift data that was transferred to the last stage of the second direction, and a start pulse that was supplied to the scanning circuit of at least one of the gate driver and the source driver monolithically formed on the substrate following the start pulse that was used as the shift data.

According to this arrangement, because the pulse with a certain width is used as a test signal for logical operations, other pulses are prevented from being recognized as the test signal.

This ensures that the scanning circuits are judged properly. Namely, it is possible to judge whether the scanning circuit is operating properly in either direction.

It is preferable in the display device that an operating state of the scanning circuit is judged according to whether the shift data transferred to the last stage of the second direction has a predetermined value after a predetermined time period from the input of the start pulse that was used as the shift data.

According to this arrangement, the scanning circuit is judged abnormal, for example, when 0 is detected at the timing that should produce 1, or 1 is detected at the timing that should produce 0.

This enables the drivers to be fabricated in a small area around the pixel array area on the substrate, thereby reducing the frame area of the substrate as compared with the structure where the driver LSI is connected by a TAB mounting method or a COG mounting method. As a result, a smaller display device can be attained.

It is preferable in the display device that the scanning circuit comprises polycrystalline silicon, or polycrystalline silicon whose crystal growth is promoted by a metal catalyst.

According to this arrangement, the scanning circuits can be formed on the substrate at a low processing temperature of 600° C. or below.

It is preferable in the display device that pixel display is carried out utilizing a liquid crystal, electrophoresis, or organic electroluminescence (organic EL (OLED)).

According to this arrangement, the display device can be implemented as a liquid crystal display device or an electroluminescence display device, for example.

It is preferable that the display device further includes phase difference detecting means for detecting a phase difference of the start pulse and the output from the last stage of the scanning circuit with respect to the shift direction of the shift data.

According to this arrangement, the scanning circuit can be accurately tested using the start pulse and the shift data, where the shift data is the output that is supplied after a predetermined delay from the last stage of the scanning circuit in the shift direction.

It is preferable in the display device that the switching means is a clocked inverter, and the shift directions are switched according to an input value to the clocked inverter.

According to this arrangement, the scanning circuit can be judged in either direction.

It is preferable in the display device that the output from the scanning circuit is divided by a multiplexer.

According to this arrangement, the number of scanning signal outputs can be increased with respect to the number of stages of shift registers to save space. Further, output pulses can be overlaid in any manner.

A scanning circuit testing method of the present invention includes the steps of: periodically supplying a clock signal and a start pulse to each of two scanning circuits of respective drivers, the start pulse having a certain width and being shifted in synchronism with the clock signal; and carrying out a logical operation using the start pulse and shift data, the shift data corresponding to the start pulse and being outputted from a last stage of the scanning circuit in a shift direction, so as to judge an operating state of each scanning circuit based on a result of the logical operation.

According to this method, the scanning circuit is tested using the start pulse and using the output that is supplied after a predetermined delay from a last stage of the scanning circuit with respect to the shift direction.

According to this arrangement, because the pulse with a certain width is used as a test signal for logical operations, other pulses are prevented from being recognized as the test signal.

This ensures that the scanning circuit is judged properly. Namely, it is possible to judge whether the scanning circuit is operating properly.

This ensures that the scanning circuits are judged properly. Namely, it is possible to judge whether the scanning circuit is operating properly in either direction. It is preferable in the display device that the logical operation is carried out for each shift direction when shift directions of the shift data are switchable between two directions, using the start pulse and the shift data that corresponds to the start pulse and is outputted from the last stage of the scanning circuit with respect to each shift direction, so as to carry out another logical operation to judge an operating state of the scanning circuit based on the result of the logical operation in each shift direction.

According to this method, it is ensured that the scanning circuit is judged in either direction.

It is preferable that the display device further includes the step of: carrying out a logical operation based on the result of the logical operation for each scanning circuit, so as to judge an operating state of each scanning circuit.

According to this method, the scanning circuit can be judged properly, for example, even in devices such as small and fine resolution panels, mobile devices, and small and high resolution display devices for projection use, without increasing the area or complexity of the circuit.

Still another scanning circuit testing method of the present invention includes the steps of: periodically supplying a clock signal and a start pulse to a scanning circuit of a driver, the start pulse having a certain width and being shifted as shift data in synchronism with the clock signal; shifting the shift data in a first direction to a last stage of the first direction and temporarily holding the shift data in a latch circuit; switching the shift direction from the first direction to the second direction and shifting the shift data that was transferred to the last stage of the first direction further in the second direction, an output of a last stage of the second direction being used with a next start pulse to judge an operating state of the scanning circuit.

According to this method, it is ensured that the scanning circuit is judged in either direction.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A display device comprising:
    a gate driver for line-sequentially selecting pixels that are disposed in a matrix, so as to scan the pixels;
    a source driver for supplying a data signal to the pixels of a selected line; and
    a substrate,
    at least one of the gate driver and the source driver being monolithically formed on the substrate,
    wherein:
    the gate driver and the source driver each comprises a scanning circuit, and the scanning circuit of at least one of the gate driver and the source driver monolithically formed on the substrate periodically receives a clock signal and a start pulse, the start pulse having a certain width and being shifted as shift data in the scanning circuit in synchronism with the clock signal, and
    the start pulse is supplied to a first logic circuit with an output that is supplied after a predetermined delay from a last stage of the scanning circuit with respect to a shift direction of the shift data corresponding to the start pulse, so as to test the scanning circuit using a first output from the first logic circuit
    wherein: at least one of the gate driver and the source driver monolithically formed on the substrate comprises switching means for switching shift directions of the shift data, the clock signal and the start pulse being supplied to the scanning circuit of at least one of the gate driver and the source driver monolithically formed on the substrate, and the first output in each shift direction is supplied to a second logic circuit, so as to test the scanning circuit using a second output from the second logic circuit.

2. The display device as set forth in claim 1, wherein the scanning circuit is tested to judge an operating state of the scanning circuit, by detecting the first output for testing from the first logic circuit after a predetermined time period from the input of the start pulse.

3. The display device as set forth in claim 1, wherein the scanning circuit is tested to judge an operating state of the scanning circuit, by detecting the second output for testing from the second logic circuit after a predetermined time period from the input of the start pulse.

4. The display device as set forth in claim 2, wherein the scanning circuit is judged normal when the first output after the predetermined time period from the input of the start pulse has a predetermined value different from values outputted before and after this timing.

5. The display device as set forth in claim 3, wherein the scanning circuit is judged normal when the second output after the predetermined time period from the input of the start pulse has a predetermined value different from values outputted before and after this timing.

6. The display device as set forth in claim 1, wherein:
the first logic circuit is composed of an NAND gate and an inverter, and the second logic circuit is composed of an NOR gate, and
the scanning circuit is judged normal when the second output after a predetermined time period from the input of the start pulse is 1 or 0 and when the second output before and after this timing is 0 or 1, with respect to the output, 0 or 1, from the last stage of the scanning circuit in the shift direction of the start pulse.

7. The display device as set forth in claim 1, further comprising:
delaying means for delaying the output from the last stage of the scanning circuit with respect to the shift direction for a predetermined time period, so as to shift the output through a predetermined number of stages.

8. The display device as set forth in claim 8, wherein the delaying means is a shift register.

9. The display device as set forth in claim 1, wherein the scanning circuit comprises polycrystalline silicon, or polycrystalline silicon whose crystal growth is promoted by a metal catalyst.

10. The display device as set forth in claim 1, wherein pixel display is carried out utilizing a liquid crystal, electrophoresis, or organic electroluminescence.

11. The display device as set forth in claim 1, further comprising phase difference detecting means for detecting a phase difference of the start pulse and the output from the last stage of the scanning circuit with respect to the shift direction of the shift data.

12. The display device as set forth in claim 1, wherein:
the switching means is a clocked inverter, and
the shift directions are switched according to an input value to the clocked inverter.

13. The display device as set forth in claim 1, wherein the output from the scanning circuit is divided by a multiplexer.

14. A display device comprising:
a gate driver for line-sequentially selecting pixels that are disposed in a matrix, so as to scan the pixels;
a source driver for supplying a data signal to the pixels of a selected line, and
a substrate,
the gate driver and the source driver being monolithically formed on the substrate,
wherein:
the gate driver and the source driver each comprises a scanning circuit that has switching means for switching shift directions, the scanning circuit periodically receiving a clock signal and a start pulse, the start pulse having a certain width and being shifted as shift data in the scanning circuit in synchronism with the clock signal, and
the start pulse supplied to the scanning circuit of the gate driver in each shift direction is supplied to a first logic circuit with an output that is outputted after a predetermined delay from a last stage of the scanning circuit of the gate driver with respect to the shift direction of the shift data corresponding to the start pulse,
the first logic circuit supplying a first output to a second logic circuit with respect to each shift direction, and
wherein:
the start pulse supplied to the scanning circuit of the source driver in each shift direction is supplied to a third logic circuit with an output that is supplied after a predetermined delay from a last stage of the scanning circuit of the source driver with respect to the shift direction of the shift data corresponding to the start pulse,
the third logic circuit supplying a third output to a fourth logic circuit with respect to each shift direction, and
the second logic circuit and the fourth logic circuit respectively supply a second output and a fourth output to a fifth logic circuit, and the fifth logic circuit supplies a fifth output that is used to test the scanning circuits of the gate driver and the source driver.

15. The display device as set forth in claim 14, further comprising a testing terminal that is connected to the fifth output.

16. The display device as set forth in claim 14, wherein the scanning circuits are tested to judge operating states of the scanning circuits, by detecting the fifth output for testing from the scanning circuits and the logic circuits after a predetermined time period from the input of the start pulse.

17. The display device as set forth in claim 14, wherein the scanning circuits are judged normal when the fifth output after the predetermined time period from the input of the start pulse has a predetermined value different from values before and after this timing.

18. The display device as set forth in claim 14, wherein:
the first logic circuit and the third logic circuit are each composed of an NAND gate and an inverter, and the second logic circuit and the fourth logic circuit are each composed of an NOR gate, and the fifth logic circuit is composed of an exclusive OR circuit, and
the scanning circuits are judged normal when the first and third outputs and the second and fourth outputs, corresponding to the start pulse, have values 1 and 0, respectively, after a predetermined time period from the input of the start pulse, and when the first and third outputs and the second and fourth outputs, corresponding to the start pulse, have values 0 and 1, respectively, before and after this timing.

19. The display device as set forth in claim 14, further comprising:
delaying means for delaying the output from the last stage of the scanning circuit with respect to the shift direction for a predetermined time period, so as to shift the output through a predetermined number of stages.

20. The display device as set forth in claim 19, wherein the delaying means is a shift register.

21. The display device as set forth in claim 14, wherein the scanning circuit comprises polycrystalline silicon, or polycrystalline silicon whose crystal growth is promoted by a metal catalyst.

22. The display device as set forth in claim 14, wherein pixel display is carried out utilizing a liquid crystal, electrophoresis, or organic electroluminescence.

23. The display device as set forth in claim 14, further comprising phase difference detecting means for detecting a phase difference of the start pulse and the output from the last stage of the scanning circuit with respect to the shift direction of the shift data.

24. The display device as set forth in claim 14, wherein:
the switching means is a clocked inverter, and
the shift directions are switched according to an input value to the clocked inverter.

25. The display device as set forth in claim 14, wherein the output from the scanning circuit is divided by a multiplexer.

* * * * *